United States Patent
Kanai

(10) Patent No.: US 11,552,553 B2
(45) Date of Patent: Jan. 10, 2023

(54) LOAD ABNORMALITY DETECTING CIRCUIT FOR INVERTER AND INVERTER APPARATUS

(71) Applicant: NETUREN CO., LTD., Tokyo (JP)

(72) Inventor: Takahiko Kanai, Tokyo (JP)

(73) Assignee: NETUREN CO., LTD., Tokyo (JP)

( * ) Notice: Subject to any disclaimer, the term of this patent is extended or adjusted under 35 U.S.C. 154(b) by 121 days.

(21) Appl. No.: 16/767,933

(22) PCT Filed: Sep. 18, 2018

(86) PCT No.: PCT/JP2018/034516
§ 371 (c)(1),
(2) Date: May 28, 2020

(87) PCT Pub. No.: WO2019/106917
PCT Pub. Date: Jun. 6, 2019

(65) Prior Publication Data
US 2020/0343806 A1     Oct. 29, 2020

(30) Foreign Application Priority Data

Nov. 29, 2017  (JP) .............................. JP2017-229431

(51) Int. Cl.
*H02M 1/32*       (2007.01)
*G01R 25/00*      (2006.01)
(Continued)

(52) U.S. Cl.
CPC ............ *H02M 1/32* (2013.01); *G01R 25/005* (2013.01); *H02M 1/08* (2013.01); *H03K 3/037* (2013.01)

(58) Field of Classification Search
CPC .......... H02M 1/32; H02M 1/08; H02M 7/539; G01R 25/005; H03K 3/037; H02H 3/38; H02H 3/382; H02H 7/1227; H02J 50/12
See application file for complete search history.

(56) References Cited

U.S. PATENT DOCUMENTS

2007/0241698 A1* 10/2007 Sung .................. H02P 25/06
318/135

FOREIGN PATENT DOCUMENTS

JP       7-177757         7/1995
JP       11235044         8/1999
(Continued)

OTHER PUBLICATIONS

"Sic Power Devices and Modules," Application Note, Rohm Semiconductor, Jun. 2013 (Year: 2013).*

(Continued)

*Primary Examiner* — Kyle J Moody
*Assistant Examiner* — Jye-June Lee
(74) *Attorney, Agent, or Firm* — Wenderoth, Lind & Ponack, L.L.P.

(57) ABSTRACT

A load abnormality detecting circuit for an inverter to detect abnormality of a load during an operation of the inverter which has a switching element and a phase synchronizing loop controlling an output frequency to be a resonance frequency of the load, the load abnormality detecting circuit includes a phase shift detection part that detects a phase shift between an output voltage and an output current which are applied from the inverter to the load and sends an abnormal load signal based on the detected phase shift. The switching element including a self-arc-extinguishing element and a reflux diode connected in reversely parallel to the self-arc-extinguishing element. The phase shift detection part detects advance and delay of a phase of the output current with respect to the output voltage.

5 Claims, 7 Drawing Sheets

(51) Int. Cl.
*H02M 1/08* (2006.01)
*H03K 3/037* (2006.01)

(56) References Cited

FOREIGN PATENT DOCUMENTS

| | | |
|---|---|---|
| JP | 3419861 | 6/2003 |
| JP | 3419861 B2 * | 6/2003 |
| JP | 3652098 | 5/2005 |
| JP | 3652098 B2 * | 5/2005 |
| JP | 2005-276701 | 10/2005 |
| JP | 2015-119583 | 6/2015 |

OTHER PUBLICATIONS

International Search Report and Written Opinion of the International Searching Authority, dated Dec. 21, 2018 in corresponding International Patent Application No. PCT/JP2018/034516.

* cited by examiner

LOAD ABNORMALITY DETECTING CIRCUIT FOR INVERTER AND INVERTER APPARATUS

TECHNICAL FIELD

The present invention relates to a load abnormality detecting circuit for an inverter, which is provided in order to protect the inverter from an influence due to abnormality of a load supplied with power from the inverter when the abnormality occurs in the load, and an inverter apparatus including the same.

BACKGROUND

An inverter apparatus is used as a power supply device that supplies AC power to a load. When power is supplied to the inverter apparatus, since it is possible to arbitrarily set a voltage value and a current value applied to the load, the power is supplied in accordance with the characteristics of the load and an amount of work to be required, so that there is no wastefulness in the supply of the power to the load and thus the supply of the power can be efficiently performed.

As an example of the inverter apparatus, as illustrated in FIG. 7, there is known an inverter apparatus 1 including a rectification circuit 10 that converts three-phase AC power to DC power by a diode 11 and a smoothing capacitor 12, a constant voltage circuit 20 that shapes an output voltage of the rectification circuit 10 to a predetermined voltage, an inverter circuit 30 that converts a DC voltage from the constant voltage circuit 20 to AC power, and a phase synchronizing loop circuit (hereinafter, abbreviated as a "PLL circuit") 40 that controls a frequency of the AC power output from the inverter circuit 30 to be a resonance frequency of a load 2. The inverter apparatus 1 is a voltage type inverter apparatus that generates the AC power having a high frequency regardable as a high frequency and has small output impedance.

The constant voltage circuit 20 is a chopper type constant voltage circuit that stably supplies a predetermined DC voltage to an output side even though there are variations in a load or an input voltage. The constant voltage circuit 20 is provided with a MOSFET 21 for power control, which is a switching element serving as a chopper body, a reactor 22 and a capacitor 23 for voltage and current smoothing, and a free-wheeling diode 24 serving as a load current path when the MOSFET 21 is turned off. The constant voltage circuit 20 can adjust an output voltage by changing a width of an ON time of a periodic signal applied to a gate of the MOSFET 21.

The inverter circuit 30 is provided with MOSFETs 31 for frequency control, which are switching elements connected in a bridge shape. A diode 32 is connected in parallel to each of the MOSFETs 31 to return a lagging current component to a DC circuit in the case of an inductive load or to reflux the lagging current component in a bridge. Furthermore, the inverter circuit 30 is provided with a current transformer 33 and a transformer 34 which are connected to the load 2 including an inductor L and a capacitor C in order to detect a current I1 and a voltage V1 to the load 2.

The PLL circuit 40 is provided with a phase comparison circuit 41 that detects phase shift of the current I1 and the voltage V1 to the load 2, an analog adder/subtractor 42 that adds/subtracts a preset frequency setting value in order to match the phase shift of the current I1 and the voltage V1 detected by the phase comparison circuit 41, a voltage controlled oscillator 43 that outputs a signal having a frequency corresponding to a voltage output from the analog adder/subtractor 42, and a gate signal control circuit 44 that sequentially sends signals to gates A to D of the MOSFETs 31 of the inverter circuit 30 in accordance with the frequency of the signal output from the voltage controlled oscillator 43.

According to such an inverter apparatus 1, the AC power having a high frequency regardable as a high frequency can be generated, so that it can be used in high frequency hardening of a steel material and the like. In addition, since the output frequency is controlled to match the phase shift of the current I1 and the voltage V1 to the load 2, the output power frequency coincides with the resonance frequency of the load 2 including the inductor L and the capacitor C, so that it is possible to efficiently operate the load 2.

During the operation of the inverter apparatus 1, when there occurs abnormality such as short-circuit and opening of a part of the load 2-side circuit, since the impedance of the load 2 is rapidly changed, the resonance frequency is greatly varied. Then, since the PLL circuit 40 of the inverter apparatus 1 controls the output frequency to follow at the resonance frequency of the load 2, a large current or voltage may be instantaneously generated in a transient state of control and thus the MOSFETs 31 may be broken. Particularly, when the phase of the current I1 advances with respect to the phase of the voltage V1 due to the change in the impedance of the load 2, a relatively large surge voltage is generated, resulting in a problem that the MOSFETs 31 is easily broken by the surge voltage. Therefore, from the standpoint of ensuring a margin for the advance of the phase of the current I1, the inverter apparatus 1 is operated in a state in which the phase of the current I1 is slightly delayed for the phase of the voltage V1. Furthermore, there is also known that the advance of the phase of the current I1 with respect to the voltage V1 is detected to reinforce the protection of the MOSFETs 31, in the related art.

A load abnormality detecting circuit for an inverter of the related art is added to the aforementioned inverter apparatus 1, detects the phase shift of the voltage V1 and the current I1 output from the inverter apparatus 1 to the load 2, and sends an abnormal load signal based on the phase shift. The load abnormality detecting circuit receives the current I1 and the voltage V1 respectively obtained from the current transformer 33 and the transformer 34 connected to the PLL circuit 40. Then, the load abnormality detecting circuit shapes the input current I1 and voltage V1 to predetermined square waves and compares the waveforms of the current I1 and of the voltage V1 with each other (see, for example, the patent document 1: JP-B2-3652098).

When there occurs abnormality in which inductance of the load resonant circuit is reduced and the resonance frequency of the load 2 is shifted from an operating frequency of the inverter apparatus 1, since the resonance circuit of the load 2 serves as a capacitive load, the phase of the current I1 advances with respect to the phase of the voltage V1. In this case, the load abnormality detecting circuit turns off all gate signals of the MOSFETs 31 of the inverter circuit 30 and also turns off the MOSFET 21 used in the chopper type constant voltage circuit 20, thereby preventing inflow of a current from an input side. In this way, the supply of power to the load 2 is stopped and the MOSFETs 31 are protected.

[Patent Document 1] JP-B2-3652098

According to the load abnormality detecting circuit for the inverter of the related art, the advance of the phase of the current I1 with respect to the voltage V1 is detected, but delay of the phase of the current I1 with respect to the voltage V1 is not detected. When there occurs the delay of the phase of the current I1 with respect to the voltage V1, a lagging current component of the current I1 flows through the diode 32 connected in parallel to the MOSFET 31. Similarly, when there occurs the advance of the phase of the current I1 with respect to the voltage V1, a leading current component of the current I1 flows through the diode 32. On the other hand, when the phases of the current I1 and the voltage V1 coincide with each other, the current I1 does not flow through the diode 32. The adjustment of the phases of the current I1 and the voltage V1, which is performed by the PLL circuit 40, can also be referred to as adjustment regarding whether to allow the current I1 to flow the MOSFET 31 or the diode 32.

Since the phase shift of the current I1 and the voltage V1 causes an increase in the lagging current component or the leading current component of the current I1 flowing through the diode 32, loss due to the diode 32 may be increased. When the diode 32, for example, is incorporated in the MOSFET 31, the MOSFET 31 generates heat as the loss due to the diode 32 increases, whereby the MOSFET 31 may be broken due to a thermal factor.

SUMMARY

One or more embodiments provide a load abnormality detecting circuit for an inverter, capable of preventing breakage of a switching element which is an important element of the inverter, and an inverter apparatus.

In an aspect (1), a load abnormality detecting circuit for an inverter to detect abnormality of a load during an operation of the inverter which has a switching element and a phase synchronizing loop controlling an output frequency to be a resonance frequency of the load, the load abnormality detecting circuit includes a phase shift detection part that detects a phase shift between an output voltage and an output current which are applied from the inverter to the load and sends an abnormal load signal based on the detected phase shift. The switching element including a self-arc-extinguishing element and a reflux diode connected in reversely parallel to the self-arc-extinguishing element. The phase shift detection part detects advance and delay of a phase of the output current with respect to the output voltage.

In an aspect (2), an inverter apparatus which has a switching element and a phase synchronizing loop controlling an output frequency to be a resonance frequency of a load, the inverter apparatus includes the load abnormality detecting circuit for the inverter according to the aspect (1).

A load abnormality detecting circuit for an inverter is capable of preventing breakage of a switching element which is an important element of the inverter.

DESCRIPTION OF ENBODIMENTS

Figure 1:
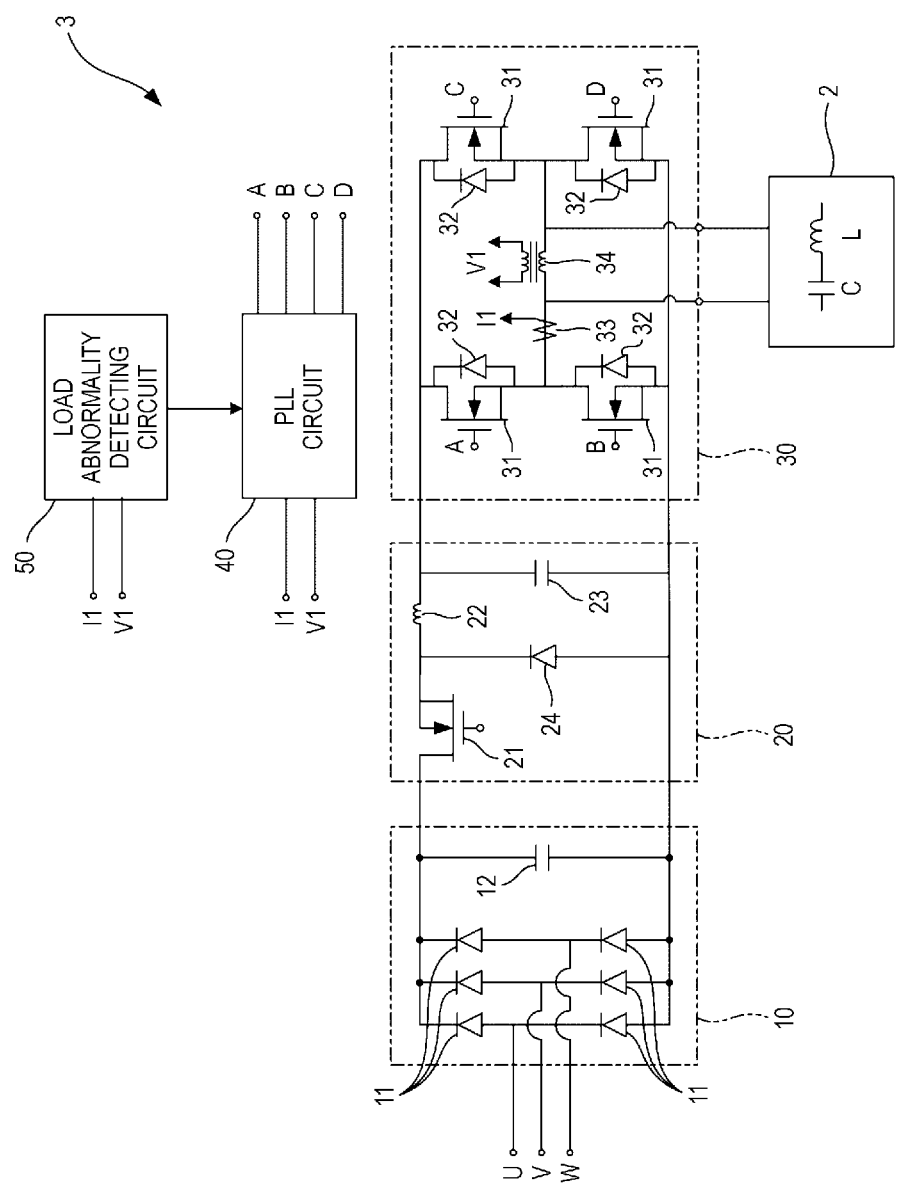
FIG. 1 is a circuit diagram illustrating an example of an inverter apparatus for explaining an embodiment of the present invention.

Hereinafter, an embodiment of the present invention is described based on the drawings. In the following description, the same reference numerals are used to designate the same elements and circuits previously described, and a description thereof is omitted or simplified.

FIG. 1 is a circuit diagram of an example of an inverter apparatus for explaining an embodiment of the present invention.

An inverter apparatus 3 illustrated in FIG. 1 is obtained by adding a load abnormality detecting circuit 50 to the aforementioned inverter apparatus 1. The MOSFET 31 of the inverter circuit 30 has an ON resistance value smaller than a forward resistance value of the diode 32, and is a SiC-MOSFET for example. The diode 32 may be incorporated in the MOSFET 31, or may be provided separately from the MOSFET 31.

Figure 2:
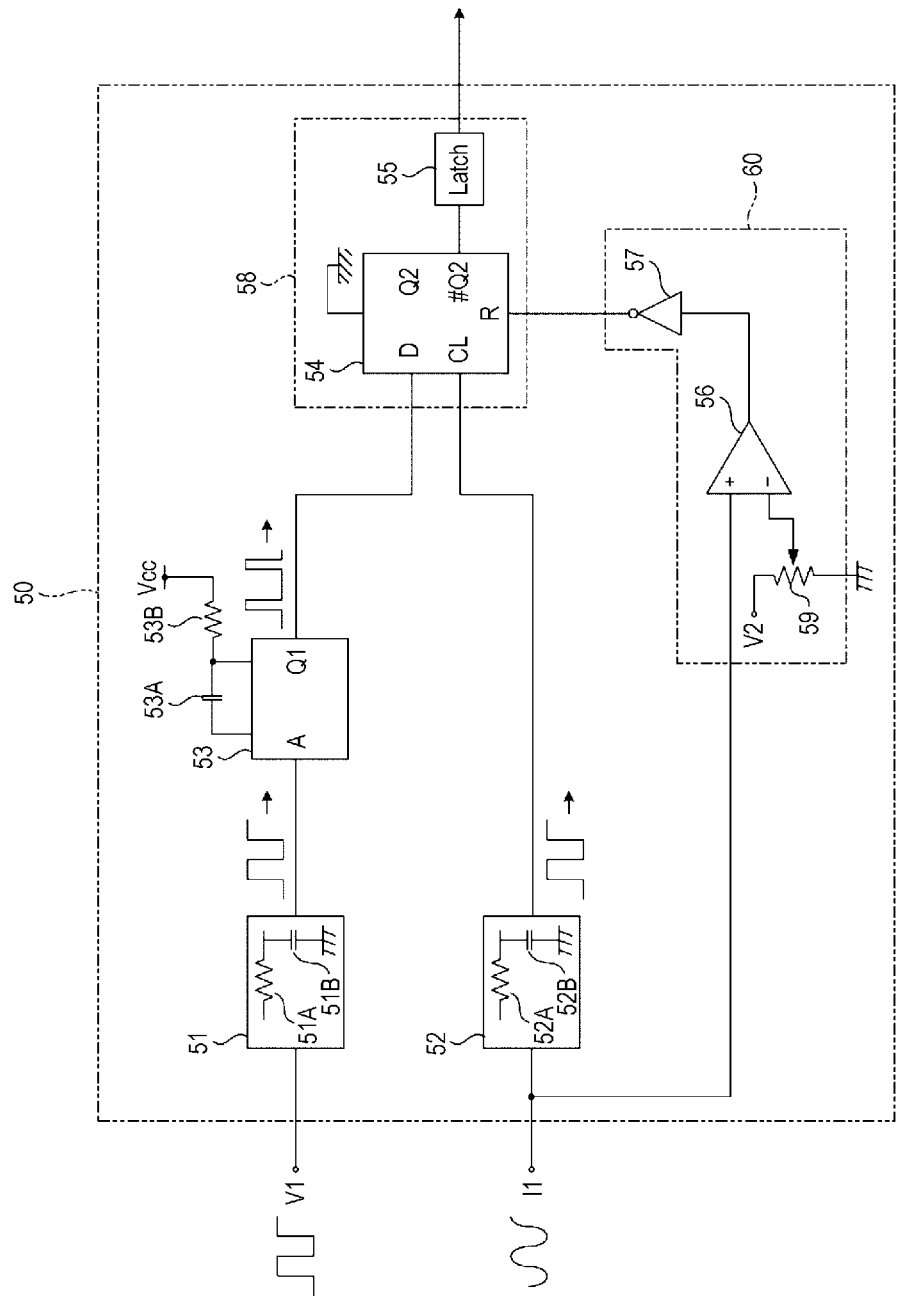
FIG. 2 is a circuit diagram illustrating a load abnormality detecting circuit for an inverter of FIG. 1.

FIG. 2 is a circuit diagram of the load abnormality detecting circuit 50.

The load abnormality detecting circuit 50 detects the phase shift of the current I1 and the voltage V1 output from the inverter apparatus 3 to the load 2, and sends an abnormal load signal to the PLL circuit 40 based on the phase shift. The current I1 obtained from the current transformer 33 and the voltage V1 obtained from the transformer 34 are input to the load abnormality detecting circuit 50.

As illustrated in FIG. 2, the load abnormality detecting circuit 50 is provided with a waveform shaper 51 for generating a pulse signal based on the voltage V1, a waveform shaper 52 for generating a pulse signal based on the current I1, a pulse width change means 53 for changing a pulse width of the pulse signal, which is output from the waveform shaper 51, based on the voltage V1, a D flip-flop 54, a latch 55 for holding output of the D flip-flop 54, a comparator 56 for detecting whether the size of the current I1 reaches a reference value, and an inverter 57 for inverting an output signal of the comparator 56.

The waveform shaper 51 includes a resistor 51A for adjusting the amplitude of a pulse signal to be generated, a capacitor 51B for cutting an unnecessary harmonic component included in the waveform of the voltage V1, and the like, and generates the pulse signal based on the voltage V1. The pulse signal is a signal in which its amplitude is periodically changed to be one of a maximum value HIGH and a minimum value LOW. The pulse waveform is preferably a square wave, but may be a triangular wave, a sawtooth wave and the like.

Similarly to the waveform shaper 51, the waveform shaper 52 includes a resistor 52A adjusting the amplitude of a pulse signal to be generated, a capacitor 52B for cutting an unnecessary harmonic component included in the waveform of the current I1, and the like, and generates the pulse signal based on the current I1.

The pulse width change means 53 changes the pulse width of the pulse signal (for example, a square wave) based on the voltage V1, which is output from the waveform shaper 51 into a pulse width PW shorter than a half cycle T/2 of the voltage V1. As the pulse width change means 53, for example, a monostable multivibrator can be used. When the pulse width change means 53 is assumed to be the monostable multivibrator, the pulse width change means 53 includes a resistor 53A and a capacitor 53B connected to a power supply Vcc, and outputs a pulse signal having a pulse width, which corresponds to an RC time constant decided by a resistance value of the resistor 53A and capacitance of the capacitor 53B, from an output port Q1 by employing a signal input to an input port A as a trigger.

The D flip-flop 54 has a clock port CL to which the pulse signal output from the waveform shaper 52 based on the current I1 is input as a clock signal, a data port D to which the pulse signal output from the pulse width change means 53, that is, the pulse signal, which is based on the voltage V1 and has the pulse width PW shorter than the half cycle T/2 of the voltage V1, is input as a data signal, a reset port R to which a reset signal is input, an output port Q2 for outputting a signal when a set state is reached, and an inversion output port #Q2 for outputting a signal when a reset state is reached contrast to the output port Q2. By the pulse width change means 53 and the D flip-flop 54, a phase shift detection means 58 is formed to detect the advance and the delay of the phase of the current I1 with respect to the voltage V1.

The comparator 56 compares sizes of AC signals respectively input to two input ports thereof with each other. An AC signal indicating the value of the current I1 to the load 2 is input to one input port of the comparator 56. An AC signal obtained by dividing a predetermined AC voltage V2 by a variable resistor 59 is input to the other input port of the comparator 56 as a preset reference value.

When the current I1 is larger than the reference value, a steady operation signal is output from the comparator 56. The steady operation signal is inverted by the inverter 57 and is sent to the reset port R of the D flip-flop 54. By the comparator 56, the inverter 57, and the variable resistor 59, a mask means 60 is formed to continuously input a reset signal to the reset port R of the D flip-flop 54 until the value of the current I1 is larger than the reference value.

After the inverter apparatus 3 starts to operate, until the operation of the inverter apparatus 3 reaches a steady state, specifically, until the operating frequency of the inverter apparatus 3 coincides with the resonance frequency of the load 2 and the current I1 to the load 2 is larger than the reference value, the mask means 60 continuously inputs the reset signal to the reset port R of the D flip-flop 54 and the phase shift detection operation of the load abnormality detecting circuit 50 is stopped. In this way, the problem, which indicates that the inverter apparatus 3 is forcedly stopped immediately after the start-up of the inverter apparatus 3 in which the current I1 to the load 2 is unstable and the phases of the current I1 and the voltage V1 do not coincide with each other, is solved. Then, when the operation of the inverter apparatus 3 reaches the steady state, the phase shift detection operation of the load abnormality detecting circuit 50 is started.

FIGS. 3 to 6 are timing charts of examples of the phase shift detection operation of the load abnormality detecting circuit 50.

In the examples illustrated in FIGS. 3 to 6, the waveform shaper 51 generates a pulse signal of a square wave based on the voltage V1 and the waveform shaper 52 generates a pulse signal of a square wave based on the current I1. Furthermore, the pulse width change means 53 outputs, from the output port Q1, the pulse signal, which rises at the rising timing of the pulse signal output from the waveform shaper 51 based on the voltage V1 and input to the input port A, and has the pulse width PW shorter than the half cycle T/2 of the voltage V1. Furthermore, the D flip-flop 54 is a rising edge trigger type D flip-flop and enters the set state when the data signal is input at the rising timing of the clock signal.

Figure 3:
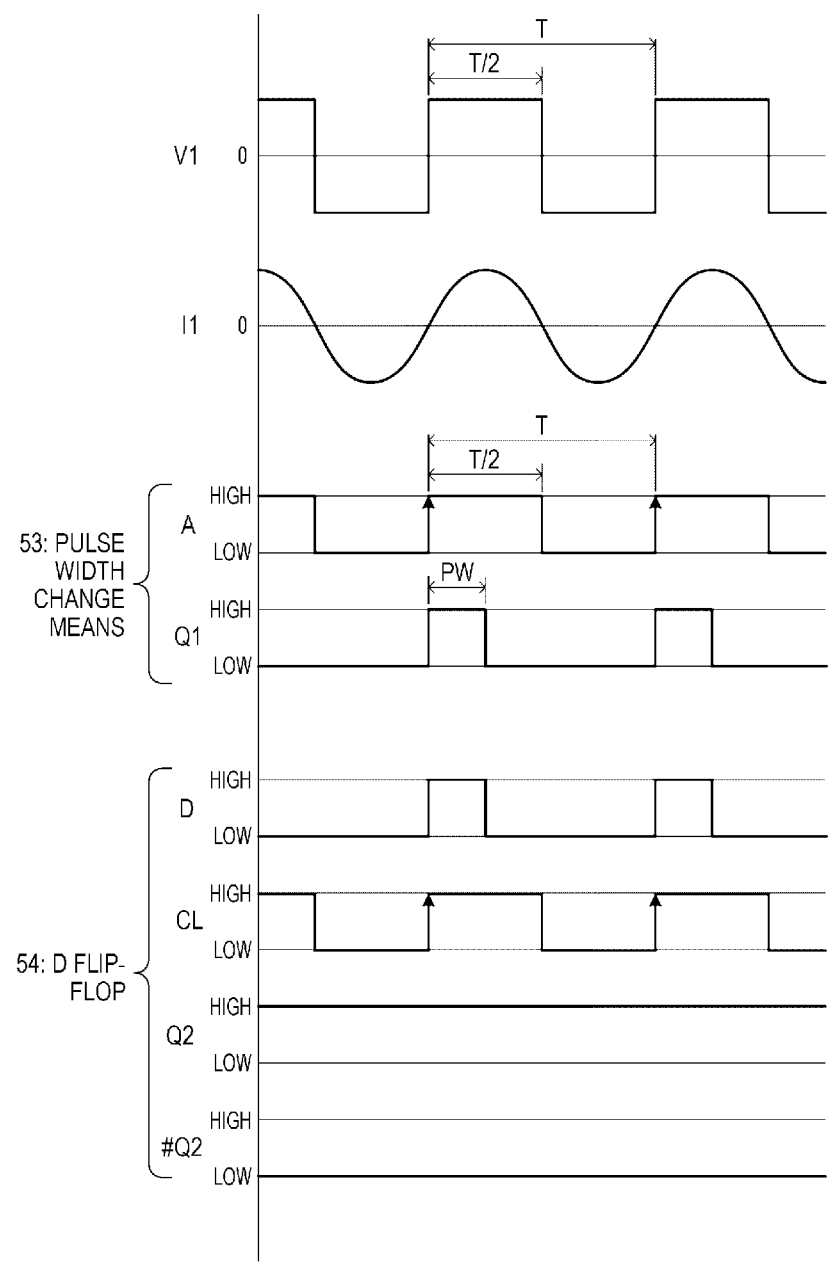
FIG. 3 is a timing chart of an example of a phase shift detection operation of the load abnormality detecting circuit for the inverter of FIG. 2.

As illustrated in FIG. 3, when the phases of the voltage V1 and the current I1 coincide with each other, since the phase of the clock signal (the pulse signal, which is output from the waveform shaper 52, based on the current I1) input to the clock port CL of the D flip-flop 54 coincides with the phase of the data signal (the pulse signal, which is output from the pulse width change means 53, based on the voltage V1) input to the data port D, the data signal is input to the data port D at the rising timing of the clock signal input to the clock port CL, so that the D flip-flop 54 enters the set state. In the set state, the output port Q2 of the D flip-flop 54 becomes HIGH and the inversion output port #Q2 becomes LOW.

Figure 4:
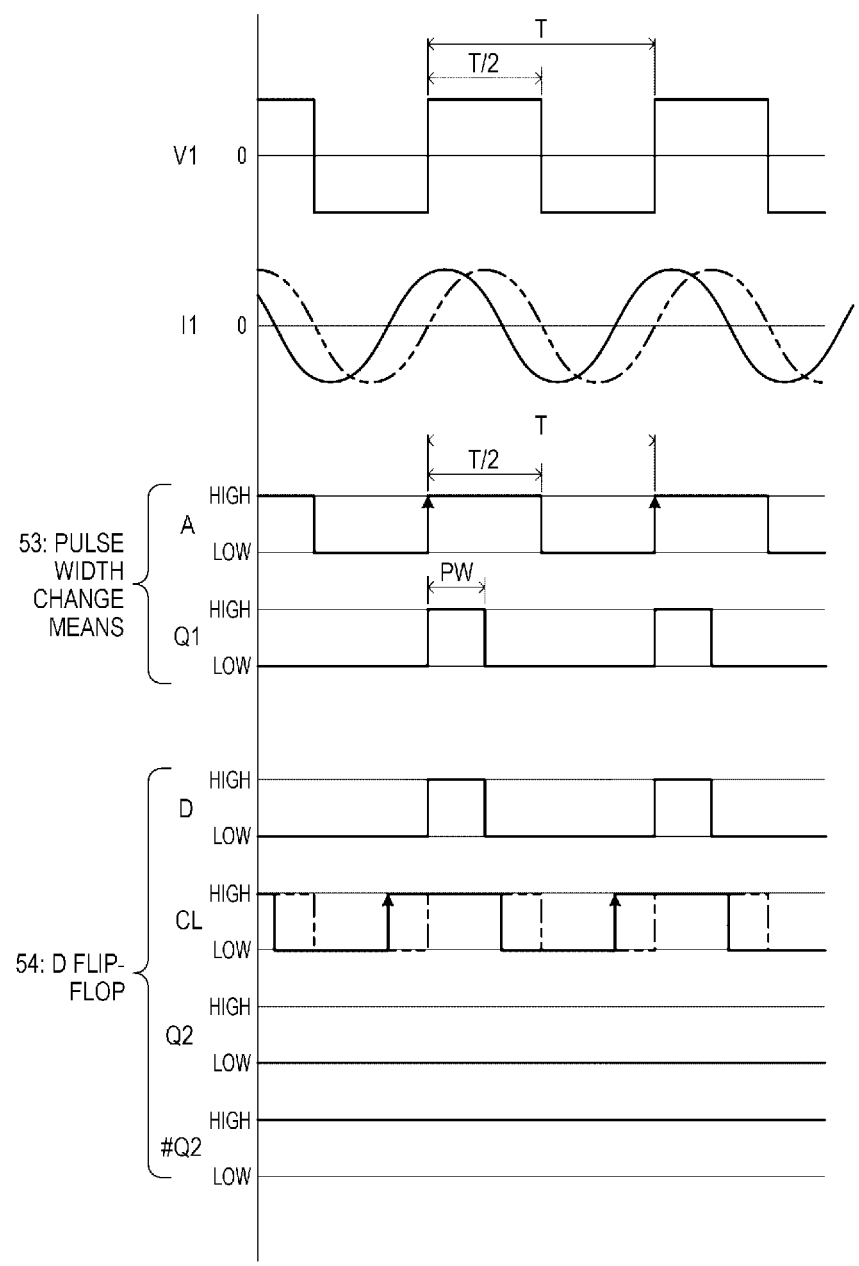
FIG. 4 is a timing chart of an example of the phase shift detection operation of the load abnormality detecting circuit for the inverter of FIG. 2.

On the other hand, as illustrated in FIG. 4, when the phase of the current I1 advances with respect to the phase of the voltage V1, since the data signal is not input to the data port D at the rising timing of the clock signal input to the clock port CL of the D flip-flop 54, the D flip-flop 54 enters a reset state. In the reset state, the output port Q2 of the D flip-flop 54 becomes LOW and the inversion output port #Q2 becomes HIGH.

Figure 5:
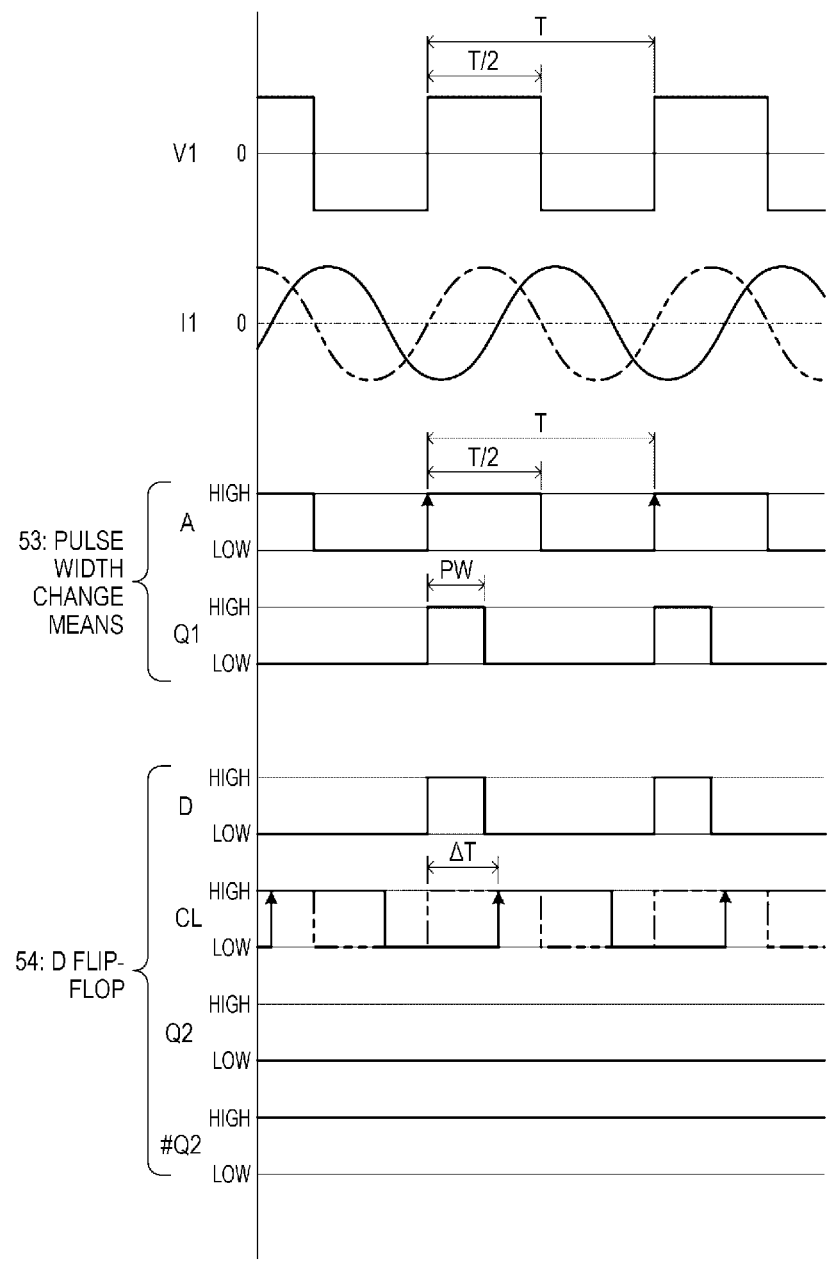
FIG. 5 is a timing chart of an example of the phase shift detection operation of the load abnormality detecting circuit for the inverter of FIG. 2.

Furthermore, as illustrated in FIG. 5, when the phase of the current I1 is delayed with respect to the phase of the voltage V1 and the delay ΔT is equal to or more than the pulse width PW of the pulse signal, which is output from the pulse width change means 53, based on the voltage V1, since the data signal is not input to the data port D at the rising timing of the clock signal input to the clock port CL of the D flip-flop 54, the D flip-flop 54 enters the reset state. In the reset state, the output port Q2 of the D flip-flop 54 becomes LOW and the inversion output port #Q2 becomes HIGH.

For example, by using the signal output from the output port Q2 of the D flip-flop 54, a case where the output signal is HIGH is assumed to be normal and a case where the output signal is LOW is assumed to be load abnormality, so that it is possible to detect the advance of the phase of the current I1 with respect to the voltage V1 and the delay of the phase equal to or more than the pulse width PW. Furthermore, by using the signal output from the inversion output port #Q2 of the D flip-flop 54, a case where the output signal is LOW is assumed to be normal and a case where the output signal is HIGH is assumed to be load abnormality, so that it is possible to detect the advance of the phase of the current I1 with respect to the voltage V1 and the delay of the phase equal to or more than the pulse width PW. The output signal of the D flip-flop 54 is input to the PLL circuit 40 of the inverter device 3 via the latch 55, and when an output signal (the abnormal load signal) indicating the load abnormality is input, the PLL circuit 40 appropriately turns off the MOSFETs 31 to stop the supply of power to the load 2, thereby protecting the MOSFETs 31 from breakage.

In addition, in the present example, based on the fact that the reset signal is continuously input to the reset port R of the D flip-flop 54 by the mask means 60 and thus the phase shift detection operation of the load abnormality detecting circuit 50 is stopped until the operation of the inverter device 3 reaches the steady state, the output signal of the inversion output port #Q2 is used (see FIG. 2) wherein a case where the output signal is LOW is assumed to be normal and a case where the output signal is HIGH is assumed to be load abnormality.

Figure 6:
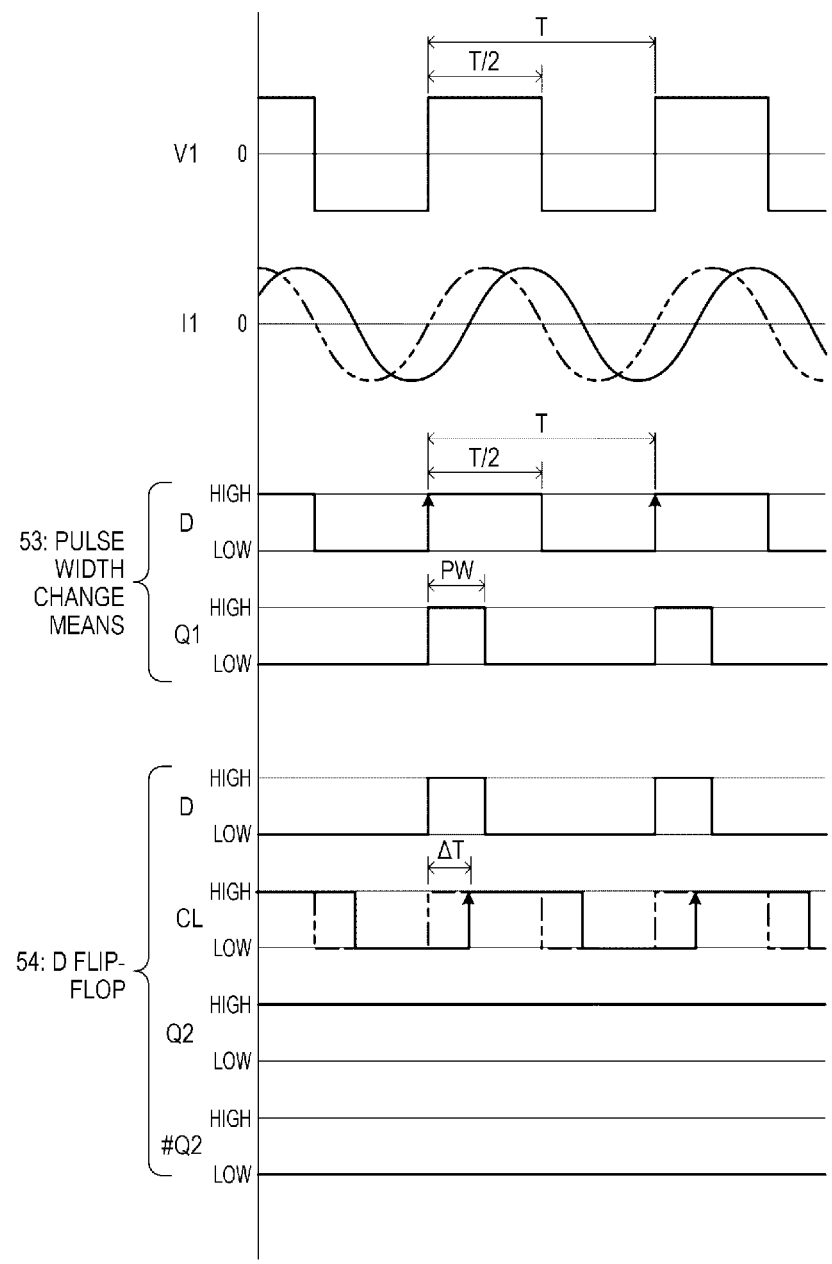
FIG. 6 is a timing chart of an example of the phase shift detection operation of the load abnormality detecting circuit for an inverter of FIG. 2.
Figure 7:
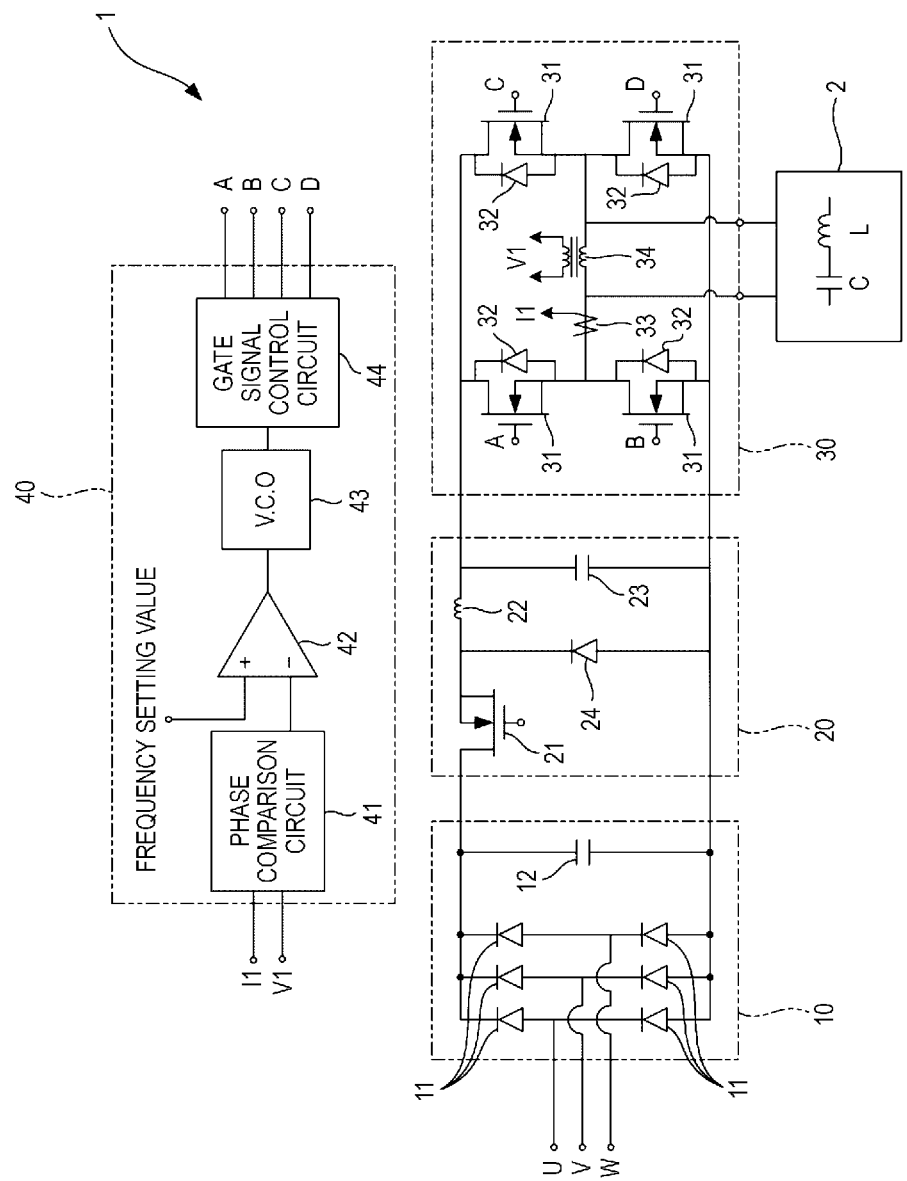
FIG. 7 is a circuit diagram of the related art.

As illustrated in FIG. 6, even though the phase of the current I1 is delayed with respect to the phase of the voltage V1, when the delay ΔT is smaller than the pulse width PW of the pulse signal, which is output from the pulse width change means 53, based on the voltage V1, since the data signal is input to the data port D at the rising timing of the clock signal input to the clock port CL of the D flip-flop 54, the D flip-flop 54 enters the set state similarly to the case where the phases of the voltage V1 and the current I1 coincide with each other as illustrated in FIG. 3. In other words, the delay of a phase smaller than the pulse width PW is permitted. The pulse width PW can be changed by the RC time constant of the pulse width change means 53 and is appropriately set in accordance with the delay of a phase to be permitted.

According to the aforementioned embodiment, there are the following effects.

Firstly, since the load abnormality detecting circuit 50 is provided to detect abnormality of the load 2 from the phase shift of the current I1 and the voltage V1 to the load 2, when the impedance of the load 2 is changed due to an accident and the like, the abnormality of the load 2 can be quickly detected from the phase shift of the current I1 and the voltage V1 occurring by variations of the resonance frequency of the load 2, and it is possible to reliably detect the abnormality of the load 2 before the PLL circuit 40 completes an operation following the resonance frequency of the load 2.

Furthermore, the delay of the phase of the current I1 with respect to the voltage V1 is detected as the phase shift of the current I1 and the voltage V1, as well as the advance of the phase of the current I1 with respect to the voltage V1, so that it is possible to suppress an increase in loss occurring when the leading current component or the lagging current component of the current I1 flows through the diode 32. Furthermore, when the diode 32 is incorporated in the MOSFET 31, it is possible to prevent the breakage of the MOSFET 31 due to heat generation of the MOSFET 31 caused by an increase in loss by the diode 32. This is particularly useful when the MOSFET 31 is a SiC-MOSFET and its ON resistance value is smaller than the forward resistance value the diode 32.

Furthermore, the phase shift detection means, which detects the advance and the delay of the phase of the current I1 with respect to the voltage V1, is configured using the pulse width change means 53 and the D flip-flop 54, the pulse signal based on the current I1 is input to the clock port CL of the D flip-flop 54, the pulse signal based on the voltage V1 is input to the data port D of the D flip-flop 54, and the advance and the delay of the phase of the current I1 with respect to the voltage V1 is detected by the states of the D flip-flop 54, so that the advance and the delay of the phase of the current I1 with respect to the voltage V1 can be detected using a simple circuit configuration and the load abnormality detecting circuit 50 can be considerably simplified.

Furthermore, the load abnormality detecting circuit 50 is provided with the mask means 60 that compares the current value of the current I1 applied to the load 2 with a preset reference value and continuously outputs the reset signal to the D flip-flop 54 until the value of the current I1 is larger than the reference value, so that it is possible to solve the problem that the phase shift detection operation of the load abnormality detecting circuit 50 is temporarily stopped at the start-up of the inverter device 3 in which the current I1 to the load 2 is unstable and the phases of the current I1 and the voltage V1 do not coincide with each other, and the inverter apparatus 3 is forcedly stopped immediately after the startup.

So far, the present invention has been described using preferred embodiments; however, the present invention is not limited to the embodiments and various improvements and design changes can be made in the range of not departing from the scope of the present invention.

For example, the rectification method of the rectification circuit is not limited to the passive method in which a diode is employed as a rectification element; an active rectification element such as a SCR may be employed and an active method for phase-controlling the active rectification element may be employed.

Furthermore, the chopper method of the constant voltage circuit is not limited to the method employing the MOSFET; a switching element such as another bipolar transistor may be employed and when a diode rectification circuit and a pulse width modulation type inverter circuit are combined with each other, the chopper type constant voltage circuit may be omitted.

Furthermore, the inverter circuit is not limited to the circuit employing the MOSFET; a switching element such as another bipolar transistor may be employed and in brief, the electrical elements, the electronic elements, and the circuit configurations of the body side of the inverter apparatus in the present invention can be appropriately selected when it is embodied.

This application claims priority to Japanese Patent Application No. 2017-229431 filed on Nov. 29, 2017, the entire content of which is incorporated herein by reference.

The invention claimed is:

1. A load abnormality detecting circuit for an inverter to detect abnormality of a load during an operation of the inverter which has a switching element and a phase synchronizing loop controlling an output frequency to be a resonance frequency of the load, the load abnormality detecting circuit comprising:
  a phase shift detection part that detects a phase shift between an output voltage and an output current which are applied from the inverter to the load and sends an abnormal load signal based on the detected phase shift,
  wherein the switching element includes a self-arc-extinguishing element and a reflux diode connected in reversely parallel to the self-arc-extinguishing element,
  the phase shift detection part detects advance and delay of a phase of the output current with respect to the output voltage,
  the phase shift detection part includes a D flip-flop having a clock port to which a pulse signal based on the output current is input as a clock signal, a data port, to which a pulse signal based on the output voltage is input as a data signal, and an output port that outputs signals according to a state,
  a pulse width change part sets a pulse width of the pulse signal based on the output voltage to a pulse width shorter than a half cycle of the output voltage, and outputs a signal to the data port of the phase shift detection part, and
  the D flip-flop is transitioned from a reset state to a set state when the data signal is input at a timing defined by the clock signal.

2. The load abnormality detecting circuit for the inverter according to claim 1, wherein
  an ON resistance value of the self-arc-extinguishing element is smaller than a forward resistance value of the reflux diode.

3. The load abnormality detecting circuit for the inverter according to claim 1, wherein
  the D flip-flop includes a reset port to which a reset signal which transitions from the set state to the reset state is input, and
  the load abnormality detecting circuit further comprising:

a mask part that compares a current value of the output current applied to the load with a predetermined reference value and inputs the reset signal to the reset port of the D flip-flop until the current value is larger than the reference value.

4. An inverter apparatus which has a switching element and a phase synchronizing loop controlling an output frequency to be a resonance frequency of a load, the inverter apparatus comprising:

the load abnormality detecting circuit for the inverter according to claim 1.

5. The inverter apparatus according to claim 4, wherein an ON resistance value of the self-arc-extinguishing element is smaller than a forward resistance value of the reflux diode.

* * * * *